United States Patent
Van Deelen et al.

(10) Patent No.: US 8,349,642 B2
(45) Date of Patent: Jan. 8, 2013

(54) METHOD FOR TREATING A METAL OXIDE LAYER

(75) Inventors: Joop Van Deelen, Eindhoven (NL); Paulus Willibrordus George Poodt, Didam (NL)

(73) Assignee: Nederlandse Organisatie Voor Toegepast-Natuurwetenschappelijk Onderzoek TNO, Delft (NL)

( * ) Notice: Subject to any disclaimer, the term of this patent is extended or adjusted under 35 U.S.C. 154(b) by 0 days.

(21) Appl. No.: 12/936,187

(22) PCT Filed: Apr. 6, 2009

(86) PCT No.: PCT/NL2009/050176
§ 371 (c)(1),
(2), (4) Date: Dec. 13, 2010

(87) PCT Pub. No.: WO2009/123459
PCT Pub. Date: Oct. 8, 2009

(65) Prior Publication Data
US 2011/0104885 A1    May 5, 2011

(30) Foreign Application Priority Data
Apr. 4, 2008    (EP) .................................. 08154100

(51) Int. Cl.
*H01L 21/00*    (2006.01)
*H01L 21/44*    (2006.01)
(52) U.S. Cl. ............................... 438/85; 438/609
(58) Field of Classification Search ............. 438/85, 438/609; 257/E31.126
See application file for complete search history.

(56) References Cited

U.S. PATENT DOCUMENTS

| | | | |
|---|---|---|---|
| 6,489,585 B1 * | 12/2002 | Nakamura et al. | 219/121.52 |
| 2003/0019519 A1 * | 1/2003 | Toyama et al. | 136/256 |
| 2003/0175444 A1 * | 9/2003 | Huang et al. | 427/523 |
| 2009/0200931 A1 * | 8/2009 | Takei et al. | 313/504 |

FOREIGN PATENT DOCUMENTS

| | | |
|---|---|---|
| DE | 10 2004 048410 A1 | 5/2006 |
| EP | 0412000 A1 | 2/1991 |
| EP | 1 452 619 A1 | 9/2004 |

OTHER PUBLICATIONS

DE 102004048410 A1, Bruesser et al., translation.*
Baik, Seung Jae et al., Highly textured and conductive undoped ZnO film using hydrogen post-treatment, Applied Physics Letters, Jun. 30, 1997, vol. 70, Issue 26, pp. 3516-3518.
Goldstein, Y. et al., Extreme accumulation layers on ZnO surfaces due to He+ ions, Physics Letters, Jul. 11, 1977, vol. 62A, Issue 1, pp. 57-58.
Ohsaki, H. et al., Plasma treatment for crystallization of amorphous thin films, Thin Solid Films, 2006, vol. 502, pp. 63-66.

(Continued)

*Primary Examiner* — William M. Brewster
(74) *Attorney, Agent, or Firm* — Knobbe, Martens, Olson & Bear, LLP

(57) ABSTRACT

The invention relates to a method for treating a metal oxide layer deposited on a substrate. The method comprises the step of applying a substantially atmospheric plasma process at a relatively low temperature. Preferably, the temperature during the plasma process is lower than approximately 180° C. Further, the atmospheric plasma process can be applied in a plasma chamber comprising $H_2$ gas and He gas.

10 Claims, 5 Drawing Sheets

OTHER PUBLICATIONS

Zhang, et al., The effect on polycrystalline ZnO film surfaces due to an Ar plasma introduced by a vacuum gauge, Thin Solid Films, Elsevier-Sequoia S.A. Lausanne, CH, vol. 257, No. 1., Feb. 15, 1995, pp. 58-62.

International Search Report dated Jun. 3, 2009 of PCT/NL2009/050176 which is the parent of this application—3pages.

* cited by examiner

METHOD FOR TREATING A METAL OXIDE LAYER

This application is the U.S. National Phase of International Application No. PCT/NL2009/050176, filed Apr. 6, 2009, designating the U.S. and published in English as WO 2009/123459 on Oct. 8, 2009 which claims the benefit of European Patent Application No. 08154100.5 filed Apr. 4, 2008.

FIELD

This invention relates to a method for treating a metal oxide layer deposited on a substrate.

BACKGROUND

Metal oxide layers serve as a layer structure, e.g. for displays and solar cells for conducting electrical currents while minimally absorbing light beams.

It appears that, depending on the deposition technique and used parameter settings, electrical properties of the metal oxide layer are not always optimal after deposit on the substrate. As an example, the electrical resistivity can be relatively high, in the order of $10^{-2}$ Ohm cm, while the mobility and charge carrier density is relatively low, in the order of 3-5 $cm^2/Vs$ and in the order of $5 \cdot 10^{19}$ $cm^{-3}$, respectively.

In order to improve the electrical properties of the metal oxide layer, it is known that a high temperature baking process, e.g. at a temperature in a range of 400-600° C. and/or a low pressure plasma treatment can result in such improvement. However, the high temperature baking process is merely applicable to structures that can sustain high temperatures. Further, the low pressure plasma treatment is expensive.

SUMMARY

It is an object of the invention to provide an alternative method for treating a metal oxide layer deposited on a substrate, wherein a lower resistivity is obtained without exposing the metal oxide layer to a relatively high temperature. Thereto, according to the invention, the method comprises applying a substantially atmospheric plasma process at a relatively low temperature.

DETAILED DESCRIPTION OF THE EMBODIMENTS

Experiments surprisingly show that by applying a plasma process that is characterized by an atmospheric pressure and a relatively low temperature, the electrical resistivity significantly reduces, thereby improving the desired electrical conductivity property of the metal oxide layer. Further, the substantially atmospheric plasma process is in principle less expensive than a reduced pressure plasma since a vacuum chamber is superfluous, and potentially more suitable for high volume processing. In addition, the relatively low temperature during the plasma process enables also metal oxides deposited on materials that are sensitive to relatively high temperatures, such as foils and more generally organic materials, to be successfully treated.

It is assumed that the original irregular, pillar-shaped morphology that might cause the bad electrical properties of the deposited metal oxide layer, is rendered more homogeneous by the atmospheric plasma process at relatively low temperatures, thereby reducing the electrical resistance of the metal oxide structure.

By applying the plasma source in a pulsed manner a relatively high power can be generated while keeping the temperature of the treated material relatively low, thereby rendering the plasma process more effective, resulting in further improved electrical properties of the metal oxide layer.

Other advantageous embodiments according to the invention are described in the following claims.

Figure 1:
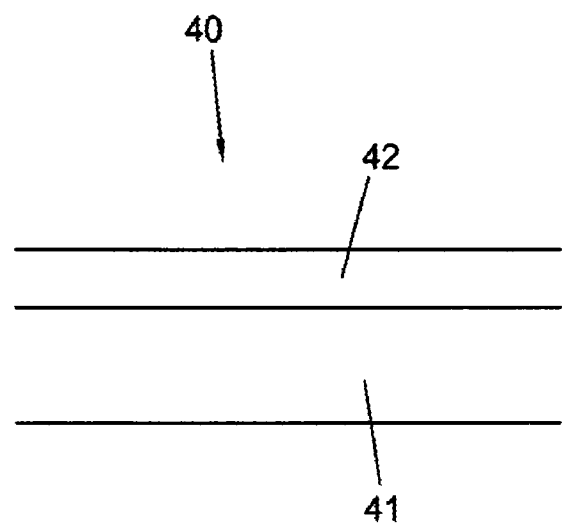
FIG. 1 shows a schematic cross sectional side view of a treated product.
Figure 2:
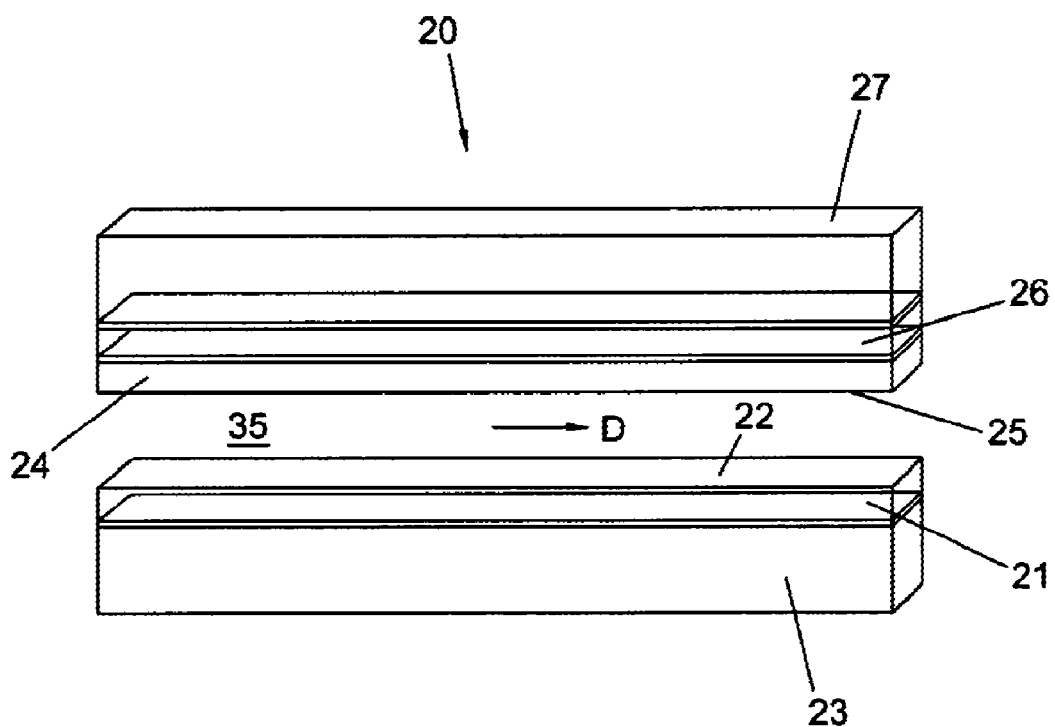
FIG. 2 shows a schematic perspective view of a first embodiment of a plasma electrode structure of the invention.
Figure 3:
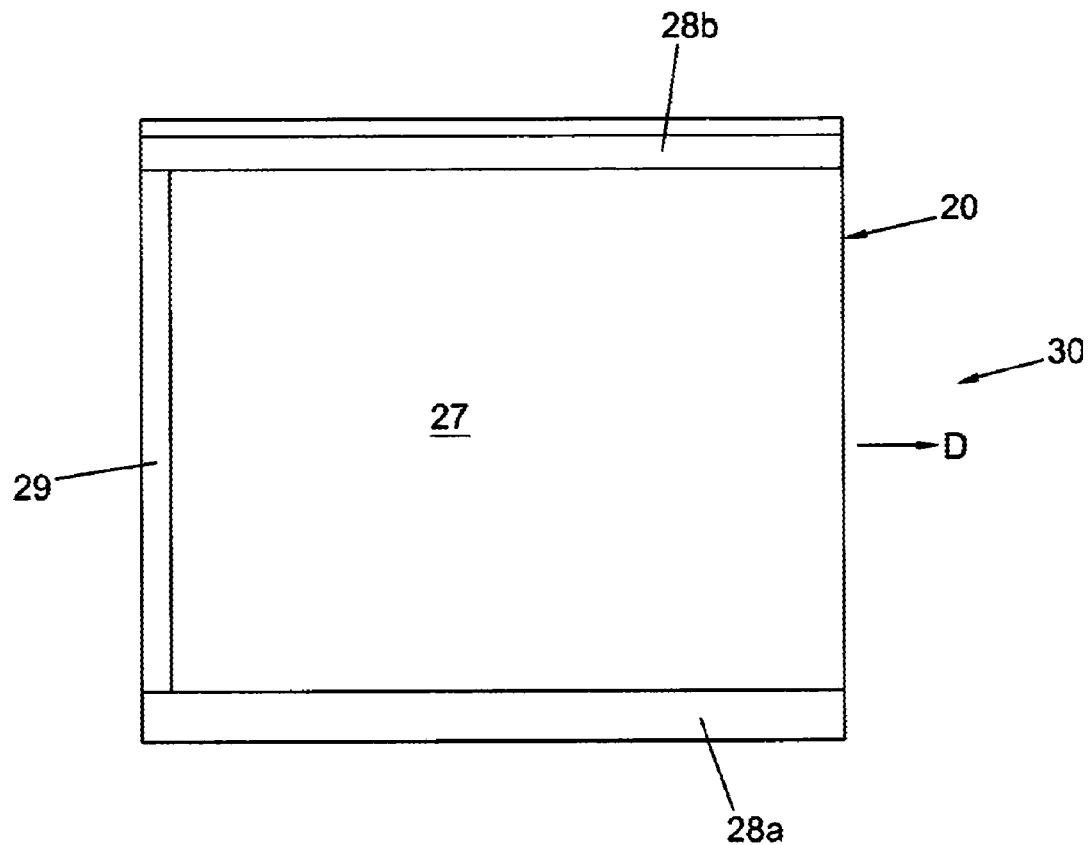
FIG. 3 shows a schematic top view of a DBD comprising the plasma electrode structure of FIG. 2.
Figure 4:
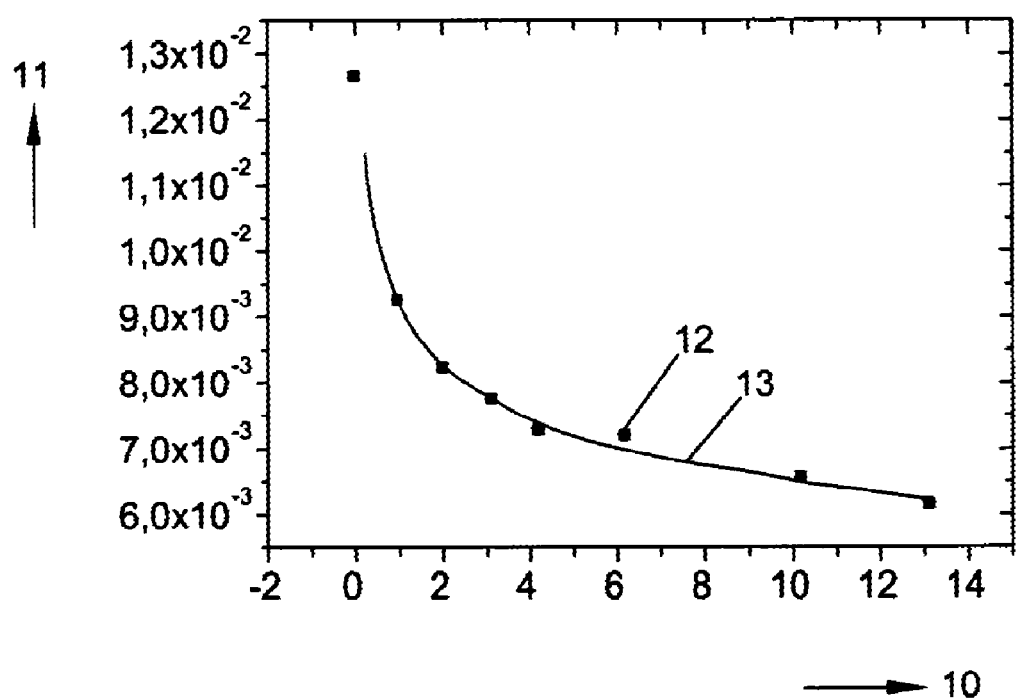
FIG. 4 shows a first diagram of an electrical resistivity as a function of a treatment time.
Figure 5:
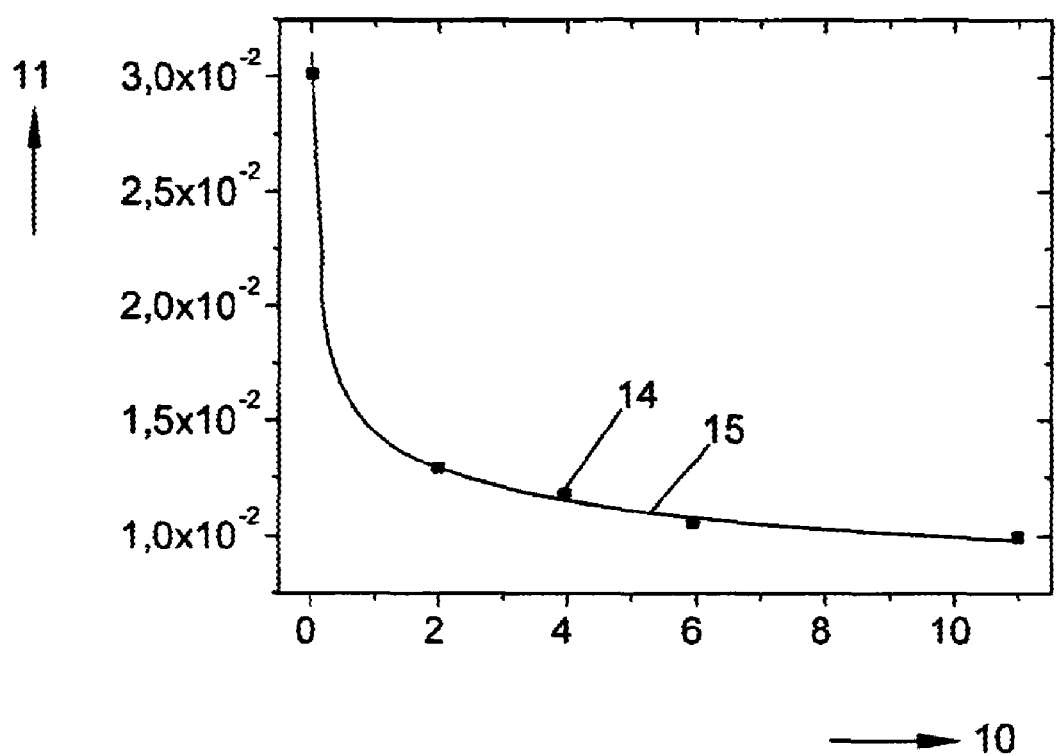
FIG. 5 shows a second diagram of an electrical resistivity as a function of a treatment time.

By way of example only, embodiments of the present invention will now be described with reference to the accompanying figures in which FIG. 1 shows a schematic cross sectional side view of a treated product.
FIG. 2 shows a schematic perspective view of a first embodiment of a plasma electrode structure of the invention;
FIG. 3 shows a schematic top view of a DBD comprising the plasma electrode structure of FIG. 2;
FIG. 4 shows a first diagram of an electrical resistivity as a function of a treatment time; and
FIG. 5 shows a second diagram of an electrical resistivity as a function of a treatment time.

The figures are merely schematic views of preferred embodiments according to the invention. In the figures, the same reference numbers refer to equal or corresponding parts.

According to the invention, a method is disclosed for treating a metal oxide layer deposited on a substrate. FIG. 1 shows a schematic cross sectional side view of a treated product 40 comprising a substrate 41 and a thin metal oxide layer 42 on top of the substrate 41. Such a thin metal oxide layer 42 is e.g. used as a coating in the field of displays, solar cells, e.g. copper indium diselenideide (CIS) photovoltaic devices, or in manufacturing electronics on flexible foils.

The metal oxide layer 42 is deposited on the substrate using available techniques, such as metal oxide chemical vapour deposition (MOCVD). As an example, the metal oxide layer is a ZnO layer. However, the method according to the invention can also be applied to other metal oxide type layers, such as a tantalum oxide ($Ta_2O_5$) layer or titanium dioxide ($TiO_2$) layer. Due to the small thickness of metal oxide layers, such layers also referred to as transparent conductive oxide (TCO) layers.

According to the invention, the metal oxide layer 42 being deposited on the substrate 41 is treated by applying a substantially atmospheric plasma process at a relatively low temperature. As shown in FIGS. 4 and 5, after application of the substantially atmospheric plasma process, electrical properties, such as the resistivity, improve.

Preferably, the temperature during the plasma process is lower than approximately 180° C., so that also metal oxides that are deposited on substrates being sensitive to high temperatures can advantageously be treated by the method according to the invention. Advantageously, the temperature during the plasma process is lower than approximately 250°

C. Further, the temperature during the plasma process may be set higher than approximately −90° C. As a result, products comprising material that physically and/or chemically irreversibly disintegrates at relatively high temperatures, such as polymer foils, can be subjected to the method according to the invention without being substantially damaged. It is noted that also temperatures higher than approximately 180° C. can be applied, e.g. in the case of silicon substrates. However, the temperature can also be set at a lower value, e.g. at 120° C. or 80° C., or even lower, e.g. at 50° C. or at room temperature.

In an advantageous embodiment according to the invention the atmospheric plasma process is applied in a plasma chamber comprising a carrier gas supplemented with $H_2$ gas. The $H_2$ gas causes material interaction with the metal oxide layer. Preferably, the carrier gas comprises He gas for facilitating the generation of the plasma. In principle, however, also other gas compositions are applicable, such as Argon gas or $N_2$ gas.

FIG. 2 shows a schematic perspective view of a first embodiment of an electrode structure 20 of a dielectric barrier discharge that can be used as a plasma source for applying the plasma process. The structure 20 comprises a bottom block-shaped dielectric 21 having a substantially flat upper boundary plane 22 facing a bottom surface of the product to be treated. Below the bottom block-shaped dielectric 21 an electrode structure is arranged, forming a first electrode 23, see in particular FIG. 2. Similarly, the structure 20 comprises a top block-shaped dielectric 24 having a substantially flat lower boundary plane 25 facing a top surface of the product to be treated. Above the top block-shaped dielectric 24 a second electrode 26 is arranged. The first and second electrodes 23, 26 are connected to output ports of a power source (not shown). Application of a voltage between the first and second electrode 23, 26 generates a plasma in a treating zone 35 between the upper surface 22 of the bottom block-shaped dielectric 21 and the lower surface 25 of the top block-shaped dielectric 24. Further, the structure 20 comprises an insulating cover 27 placed on top of the second electrode 26. The electrode structure 20 shown in FIGS. 2 and 3 is known to form a DBD (dielectric barrier discharge). During operation of the structure 20, the substrate on which the metal oxide layer is deposited is present in said treating zone 35. Optionally, the substrate is transported in a transport direction D parallel to the upper surface 22 and/or the lower surface 25.

FIG. 3 shows a schematic top view of a DBD 30 comprising the electrode structure 20 of FIG. 2. Here, the electrode structure 20 comprising the insulating cover 27 is arranged between two substantially parallel extending gas flow shielding walls 28a, 28b to form a plasma chamber. The optional transport direction D wherein the substrate including the metal oxide layer can be transported is substantially parallel with respect to the orientation of the gas flow shielding walls 28a, 28b. Further, the DBD comprises a gas injector 29 extending between the gas flow shielding walls 28a, 28b. The gas injector 29 is arranged for injecting the carrier gas supplemented with $H_2$ gas to facilitate a plasma process.

It is noted that the substantially atmospheric plasma process can be performed in an open structure, e.g. an open plasma chamber. Since the plasma process is substantially atmospheric the method can be applied without using a closed or sealed chamber.

It is further noted that the electrode structure 20 can be implemented in a number of embodiments. As an example, the electrodes can be embedded in a dielectric (coplanar DBD) or can be positioned adjacent to but outside the dielectric (surface DBD). Further, an electrode structure can be applied wherein the electrodes are arranged inside or adjacent to a single dielectric thereby rendering a second dielectric superfluous. In addition, various electrode patterns can be applied, such as a planar plate-shaped electrode or a comb-shaped electrode.

FIGS. 4 and 5 show a first and second diagram, respectively, of an electrical resistivity [Ohm cm] 11 as a function of a treatment time [minutes] 10 of a metal oxide layer. FIG. 4 relates to a ZnO layer on a silicon substrate wherein the ZnO layer is doped with Aluminium. Further, FIG. 5 relates to a ZnO layer that is undoped. The experimental measurements are denoted by bold squares 12, 14 in the diagrams, while the curves 13, 15 fit the measurements. As can be derived from the diagrams, the resistivity dramatically reduces after treatment by the atmospheric plasma process. The resistivity reduces a factor 2-3 after a treatment of approximately 10 minutes. The diagrams further show that a doping applied to the substrate material influences the electrical resistivity. It is assumed that the doped material is activated by the plasma process so as to improve the conductivity of the metal oxide layer.

The samples on which the measurements have been performed comprise a ZnO top layer having a thickness ranging from 500 to 700 nm deposited on a silicon substrate. Between the ZnO top layer and the silicon substrate, the samples comprise a 500 nm thick $SiO_2$ intermediate layer. In the atmospheric plasma process a dielectric barrier discharge source has been used while the plasma chamber comprises He gas as a carrier gas having a flow of 77 l/min while a fraction of 1 volume percentage of $H_2$ gas has been added to the carrier gas. The power of the plasma source has been set to 300 Watt. The resistivity has been measured by means of a four-point probe.

By applying a pulsed plasma source, the temperature of the material that is subjected to the plasma remains relatively low while a relatively large power can be applied, thereby improving the performance of the plasma process and improving the electrical properties of the metal oxide layer. In an alternative embodiment, the plasma is activated by a harmonic signal on the respective electrodes.

Optionally, the atmospheric plasma process is repeatedly applied to the metal oxide layer, thereby even further improving electrical properties of metal oxide layer. However, the atmospheric plasma process can also be applied once, e.g. in order to obtain a fast and relatively cheap process.

The invention is not restricted to the embodiments described herein. It will be understood that many variants are possible. Instead of a surface DBD or coplanar DBD electrode structure, a plasma jet or a microwave source can be applied for generating the plasma.

Further, the electrode structure of a surface DBD or coplanar DBD electrode structure is not necessary substantially planar, but may have any shape, e.g. they can have a curved shape, such as a cylinder or a drum. In the case of surface DBD the metal tracks 21 could be covered by a protective layer in order, for example, to minimize sputtering. In the case of coplanar DBD electrodes, metal tracks do not need to be embedded in the dielectric at the same level. Further, an additional third electrode can be applied in order, e.g. to reduce ignition voltage. The third electrode can be embedded in the dielectric material, e.g. ceramic, or placed on its surface. Also, an additional ceramic layer can be added to the surface of coplanar DBD electrode element in order to reduce the ignition voltage. Further, an additional electrode can be placed over the surface of the metal oxide layer in order, for example, to increase the thickness of the plasma.

Further such variants will be obvious for the man skilled in the art and are considered to lie within the scope of the invention as formulated in the following claims.

What is claimed is:

1. A method for treating a metal oxide layer deposited on a substrate, comprising applying a substantially atmospheric plasma process at a temperature lower than approximately 180° C., further comprising applying a dielectric barrier discharge as a plasma source, reducing the electrical resistivity with a factor ranging from circa 2 to circa 3.

2. The method according to claim 1, wherein the atmospheric plasma process is applied in a plasma chamber comprising a carrier gas supplemented with $H_2$ gas.

3. The method according to claim 2, wherein the carrier gas comprises He gas.

4. The method according to claim 1, wherein the metal oxide layer is a ZnO layer.

5. The method according to claim 1, wherein the substrate comprises material that physically and/or chemically irreversibly disintegrates at relatively high temperatures.

6. The method according to claim 1, further comprising applying the metal oxide layer as a coating on a display or solar cell.

7. The method according to claim 1, further applying the plasma source in a pulsed manner.

8. The method according to claim 1, further comprising repeatedly applying the substantially atmospheric plasma process to the metal oxide layer.

9. A method for treating a metal oxide layer deposited on a substrate, comprising applying a substantially atmospheric plasma process at a temperature lower than approximately 180° C., further comprising applying a dielectric barrier discharge as a plasma source, reducing the electrical resistivity with a factor ranging from circa 2 to circa 3 after applying the plasma process for a period of approximately 10 minutes.

10. A method for treating a metal oxide layer deposited on a substrate, comprising applying a substantially atmospheric plasma process at a temperature lower than approximately 180° C., further comprising applying a dielectric barrier discharge as a plasma source, reducing the electrical resistivity to below the order of circa $3.0 \times 10^{-2}$ [Ohm.cm].

* * * * *